(12) United States Patent
Kakimoto et al.

(10) Patent No.: US 9,005,459 B2
(45) Date of Patent: Apr. 14, 2015

(54) FILM DEPOSITION METHOD AND FILM DEPOSITION APPARATUS

(75) Inventors: Akinobu Kakimoto, Yamanashi (JP); Satoshi Takagi, Yamanashi (JP); Toshiyuki Ikeuchi, Yamanashi (JP); Katsuhiko Komori, Yamanashi (JP); Kazuhide Hasebe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 75 days.

(21) Appl. No.: 13/420,723

(22) Filed: Mar. 15, 2012

(65) Prior Publication Data
US 2012/0267340 A1    Oct. 25, 2012

(30) Foreign Application Priority Data

Mar. 18, 2011    (JP) .................... 2011-061216

(51) Int. Cl.
*B44C 1/22* (2006.01)
*B05C 11/00* (2006.01)
*H01L 21/02* (2006.01)
*C23C 16/04* (2006.01)
*C23C 16/455* (2006.01)
*H01J 37/32* (2006.01)
*H01L 21/311* (2006.01)
*H01L 21/67* (2006.01)

(52) U.S. Cl.
CPC ........ *H01L 21/02164* (2013.01); *C23C 16/045* (2013.01); *C23C 16/45546* (2013.01); *H01J 37/32091* (2013.01); *H01J 37/3244* (2013.01); *H01J 37/32779* (2013.01); *H01L 21/02337* (2013.01); *H01L 21/31116* (2013.01); *H01L 21/67109* (2013.01)

(58) Field of Classification Search
None
See application file for complete search history.

(56) References Cited

U.S. PATENT DOCUMENTS

| | | | | |
|---|---|---|---|---|
| 5,030,319 | A  * | 7/1991 | Nishino et al. | 216/87 |
| 5,252,133 | A  * | 10/1993 | Miyazaki et al. | 118/725 |
| 5,282,925 | A  * | 2/1994 | Jeng et al. | 216/59 |
| 5,314,724 | A  * | 5/1994 | Tsukune et al. | 427/489 |
| 5,656,827 | A  * | 8/1997 | Kang et al. | 257/76 |
| 5,920,791 | A  * | 7/1999 | Yang et al. | 438/622 |
| 6,030,881 | A  * | 2/2000 | Papasouliotis et al. | 438/424 |
| 6,867,086 | B1 * | 3/2005 | Chen et al. | 438/219 |
| 7,078,312 | B1 * | 7/2006 | Sutanto et al. | 438/424 |
| 7,217,658 | B1 * | 5/2007 | Bayman et al. | 438/680 |
| 7,482,247 | B1 * | 1/2009 | Papasouliotis et al. | 438/437 |
| 7,910,491 | B2 * | 3/2011 | Soo Kwon et al. | 438/738 |
| 7,939,422 | B2 * | 5/2011 | Ingle et al. | 438/435 |
| 7,951,683 | B1 * | 5/2011 | Shanker | 438/404 |
| 8,133,797 | B2 * | 3/2012 | van Schravendijk et al. | 438/427 |
| 8,148,267 | B2 * | 4/2012 | Cho et al. | 438/704 |

(Continued)

FOREIGN PATENT DOCUMENTS

| | | |
|---|---|---|
| JP | 2004-343094 A | 12/2004 |
| JP | 2007-305981 | 11/2007 |
| JP | 2010-073773 | 4/2010 |

*Primary Examiner* — Allan Olsen
(74) *Attorney, Agent, or Firm* — IPUSA, PLLC

(57) ABSTRACT

A disclosed film deposition method includes steps of loading plural substrates each of which includes a pattern including a concave part in a reaction chamber in the form of shelves; depositing a silicon oxide film on the plural substrates by supplying a silicon-containing gas and an oxygen-containing gas to the reaction chamber; etching the silicon oxide film deposited on the plural substrates in the step of depositing by supplying a fluorine-containing gas and an ammonia gas to the reaction chamber; and alternately repeating the step of depositing and the step of etching.

4 Claims, 7 Drawing Sheets

(56) References Cited

U.S. PATENT DOCUMENTS

| | | | |
|---|---|---|---|
| 2004/0110354 A1* | 6/2004 | Natzle et al. | 438/365 |
| 2004/0166694 A1* | 8/2004 | Won et al. | 438/787 |
| 2006/0185592 A1* | 8/2006 | Matsuura | 118/715 |
| 2006/0216941 A1 | 9/2006 | Hasebe et al. | |
| 2007/0003698 A1* | 1/2007 | Chen et al. | 427/248.1 |
| 2007/0026147 A1* | 2/2007 | Chen et al. | 427/248.1 |
| 2008/0142483 A1* | 6/2008 | Hua et al. | 216/67 |
| 2008/0286697 A1* | 11/2008 | Verhaverbeke et al. | 430/322 |
| 2009/0039390 A1* | 2/2009 | Murthy et al. | 257/190 |
| 2009/0275202 A1* | 11/2009 | Tanaka et al. | 438/700 |
| 2009/0298257 A1* | 12/2009 | Lee et al. | 438/428 |
| 2010/0189927 A1* | 7/2010 | Sato et al. | 427/579 |
| 2010/0210099 A1* | 8/2010 | Hur et al. | 438/586 |
| 2011/0151676 A1* | 6/2011 | Ingle et al. | 438/763 |
| 2011/0193049 A1* | 8/2011 | Iwakaji et al. | 257/4 |
| 2012/0064733 A1* | 3/2012 | Sasajima et al. | 438/787 |
| 2012/0309999 A1* | 12/2012 | Kiehlbauch et al. | 556/400 |
| 2013/0048605 A1* | 2/2013 | Sapre et al. | 216/51 |
| 2013/0059415 A1* | 3/2013 | Kato et al. | 438/106 |
| 2013/0068159 A1* | 3/2013 | Maeda et al. | 118/666 |

* cited by examiner

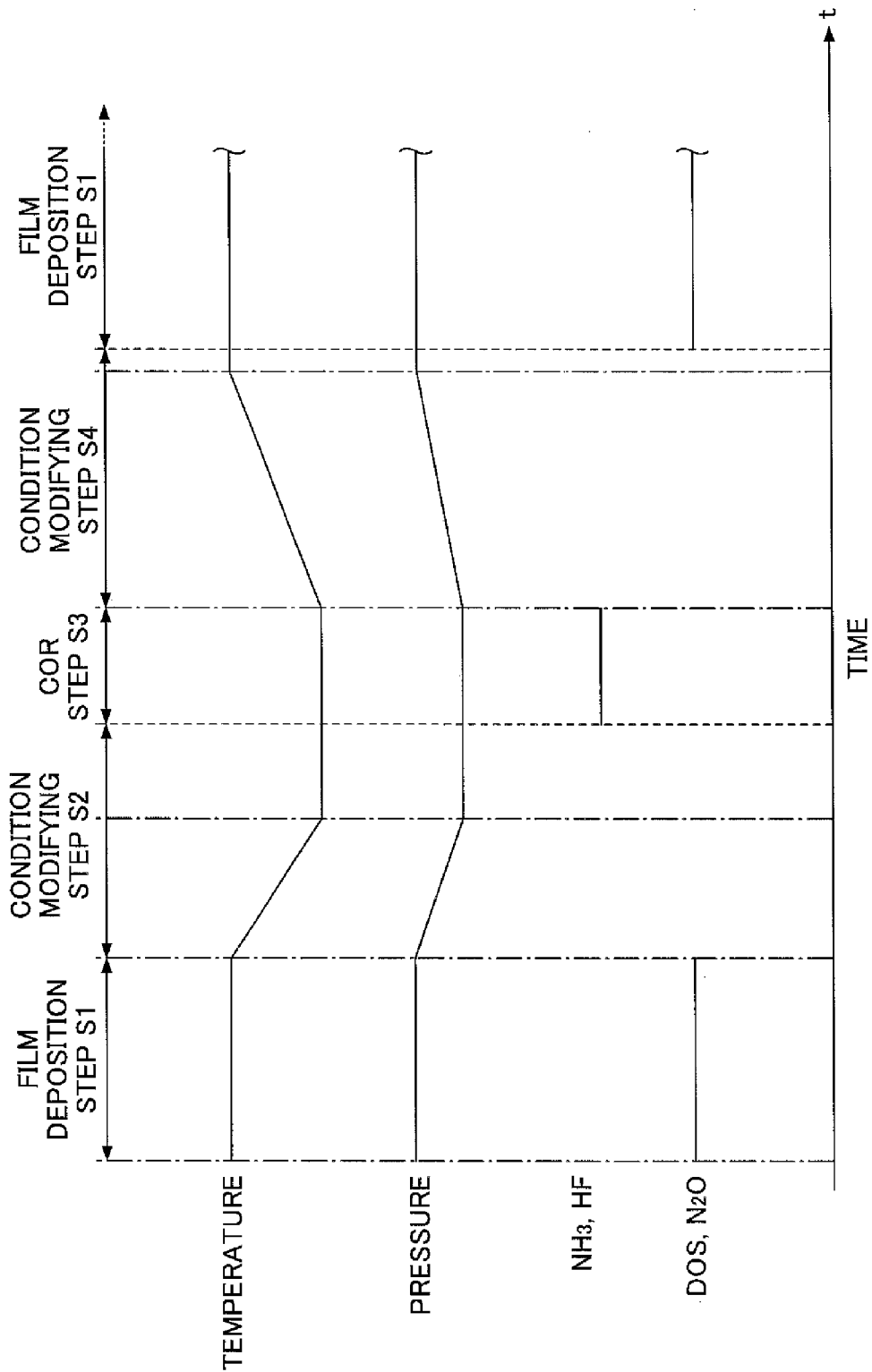

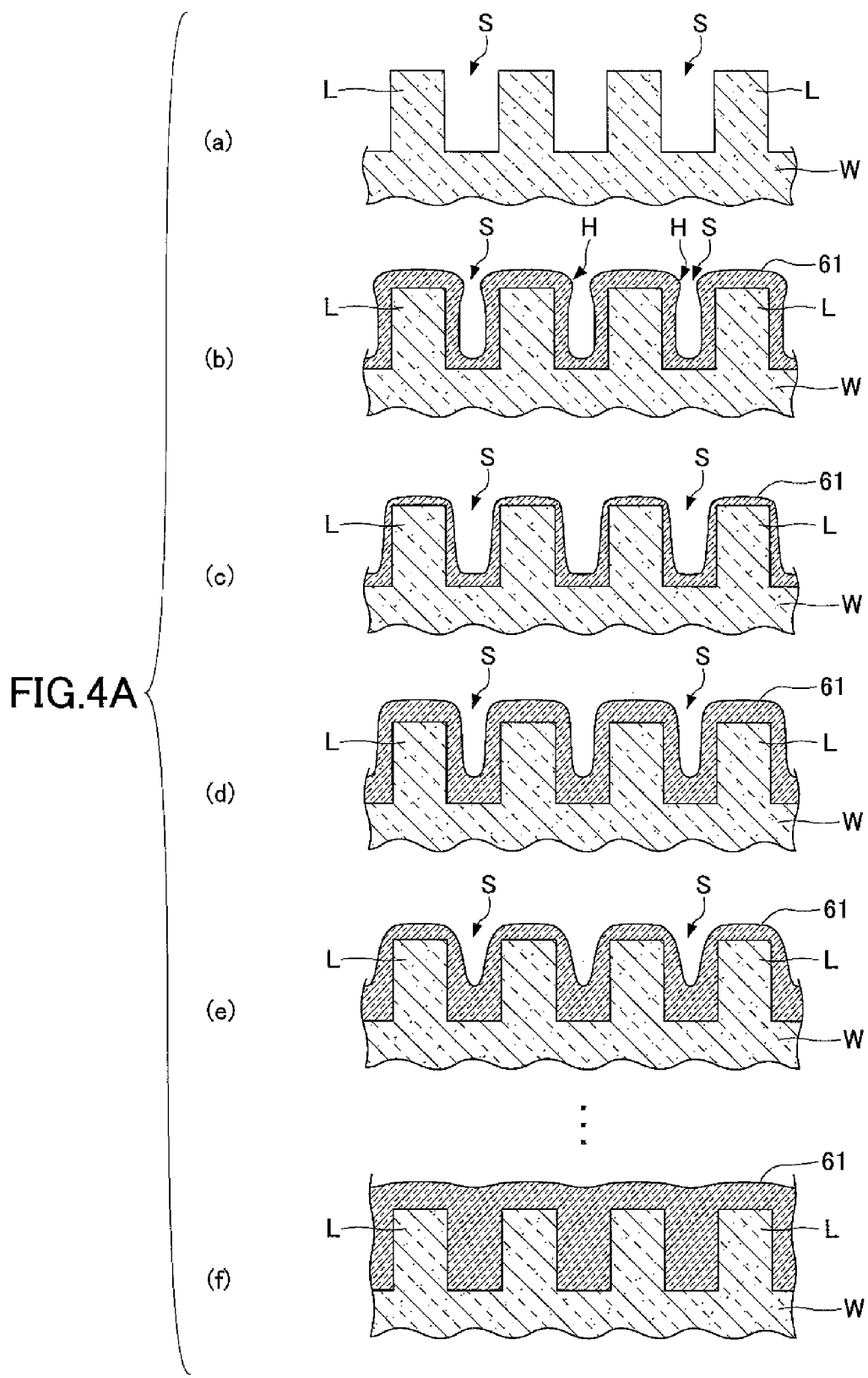

FILM DEPOSITION METHOD AND FILM DEPOSITION APPARATUS

CROSS-REFERENCE TO RELATED APPLICATION

The present application is based on Japanese Patent Application No. 2011-061216 filed with the Japanese Patent Office on Mar. 18, 2011, the entire contents of which are hereby incorporated herein by reference.

BACKGROUND OF THE INVENTION

1. Field of the Invention

The present invention relates to a film deposition method and a film deposition apparatus that deposits a silicon oxide film on a substrate with a pattern including a concave part formed thereon.

2. Description of the Related Art

A fabrication method of an integrated circuit (IC) includes a step to fill a space of a line-and-space pattern with, for example, silicon oxide. Along with advancement in degree of integration of ICs, a width of the space of the space-and-line pattern has now been reduced to, for example, about 30 nm. In order to fill such a space with silicon oxide by using, for example, a chemical vapor deposition (CVD) method, the silicon film is likely to be thicker in an upper part of an inner side wall of the space, because it is difficult for precursors to proceed further into a bottom of the space. As a result, a void may be caused in the silicon oxide filling in the space. In this case, when the silicon oxide is etched in the subsequent process step, an opening may be formed in the upper part of the silicon oxide, so that the opening is in communication with the void. If this happens, an etching agent used in the etching process step may flow into the void through the opening, so that the etching agent having flowed into the void may cause contamination in subsequent processes. Alternatively, in a subsequent metallization step, metal may enter the void through the opening in the silicon oxide, so that the metal causes defects.

Patent Document 1: Japanese Patent Application Laid-Open Publication No. 2010-73773.

SUMMARY OF THE INVENTION

In order to solve such problems, an attempt has been made by performing a film deposition and a sputter etching at the same time in accordance with a high density (HDP)-CVD method, thereby improving a filling characteristic. However, while the HDP-CVD method can be carried out in a single-wafer type CVD apparatus, a sufficient uniformity cannot be obtained in a batch type CVD apparatus that is advantageous in terms of throughput.

The present invention has been made in view of the above, and provides a batch-type film deposition apparatus and a film deposition method that are capable of realizing an improved filling characteristic.

A first aspect of the present invention provides a film deposition method comprising steps of loading plural substrates each of which includes a pattern including a concave part in a reaction chamber in the form of shelves; depositing a silicon oxide film on the plural substrates by supplying a silicon-containing gas and an oxygen-containing gas to the reaction chamber; etching the silicon oxide film deposited on the plural substrates in the step of depositing by supplying a fluorine-containing gas and an ammonia gas to the reaction chamber; and alternately repeating the step of depositing and the step of etching.

A second aspect of the present invention provides a film deposition apparatus including a substrate supporting member that supports plural substrates each of which includes a pattern including a concave part in a reaction chamber in the form of shelves; a reaction chamber that has a cylindrical shape with a closed top and an open bottom, the reaction chamber accommodating the substrate supporting member; a silicon-containing gas supplying part that supplies a silicon-containing gas to the plural substrates supported by the substrate supporting member; an oxygen-containing gas supplying part that supplies an oxygen-containing gas to the plural substrates supported by the substrate supporting member; a fluorine-containing gas supplying part that supplies a fluorine-containing gas to the plural substrates supported by the substrate supporting member; an ammonia gas supplying part that supplies an ammonia gas to the plural substrates supported by the substrate supporting member; and a controlling part that controls the silicon-containing gas supplying part, the oxygen-containing gas supplying part, the fluorine-containing gas supplying part, and the ammonia-containing gas supplying part so that a silicon oxide film is deposited on the plural substrates by supplying the silicon-containing gas and the oxygen-containing gas to the reaction chamber, and the silicon oxide film deposited on the plural substrates is etched by supplying the fluorine-containing gas and the ammonia gas to the reaction chamber.

BRIEF DESCRIPTION OF THE DRAWINGS

FIG. 3 is a time chart illustrating a film deposition method according to a second embodiment;

FIG. 4A is a schematic cross-sectional view of a substrate and a silicon oxide film after corresponding primary steps of the film deposition method according to the second embodiment;

DETAILED DESCRIPTION OF THE PREFERRED EMBODIMENT

Figure 1:
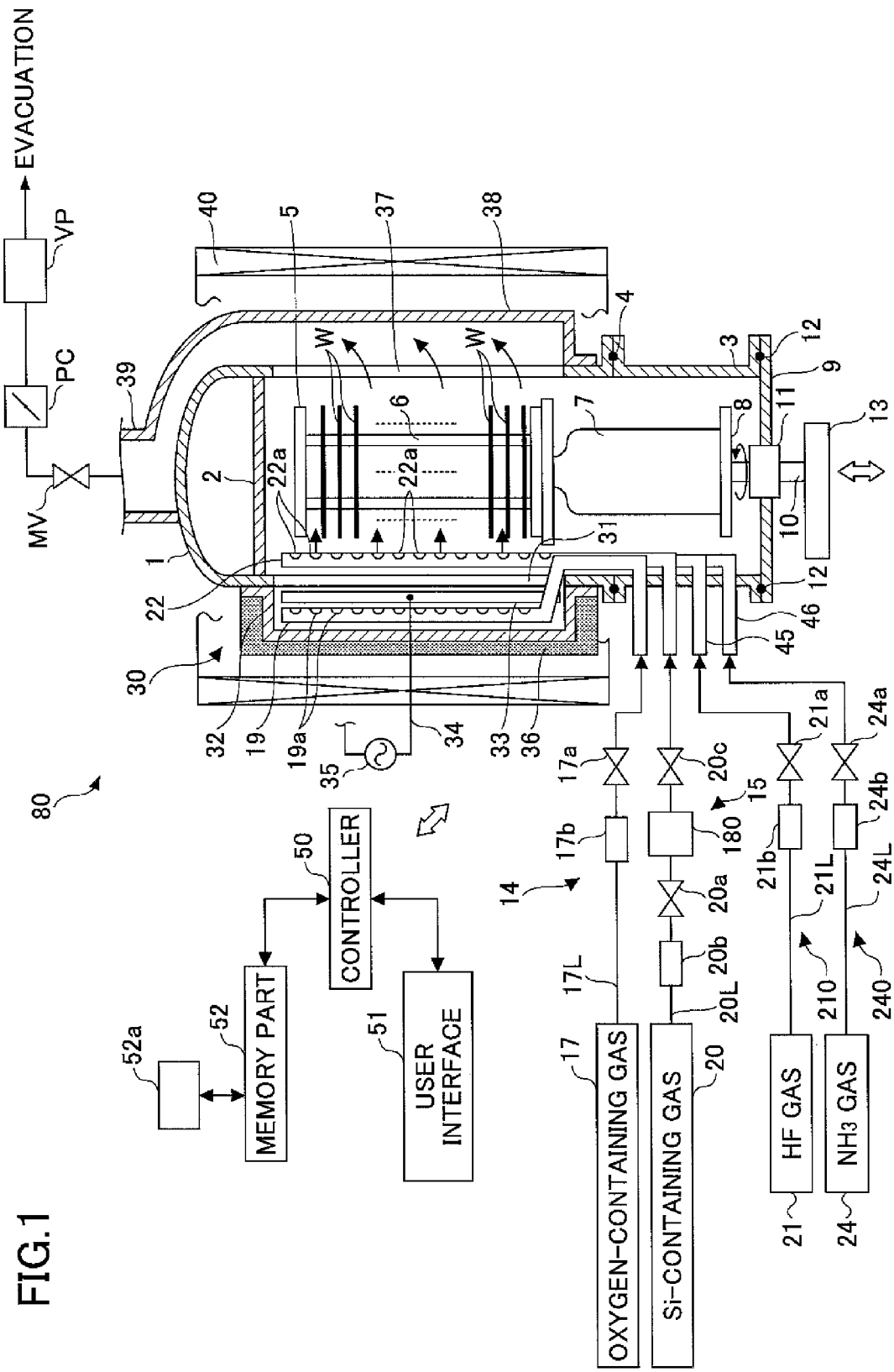
FIG. 1 is a schematic view of a film deposition apparatus according to a first embodiment of the present invention.

Non-limiting, exemplary embodiments of the present invention will now be described with reference to the accompanying drawings. In the drawings, the same or corresponding reference symbols are given to the same or corresponding members or components. It is to be noted that the drawings are illustrative of the invention, and there is no intention to indicate scale or relative proportions among the members or components, or between thicknesses of various layers. Therefore, the specific thickness or size should be determined by a person having ordinary skill in the art in view of the following non-limiting embodiments.

(First Embodiment)

Figure 2:
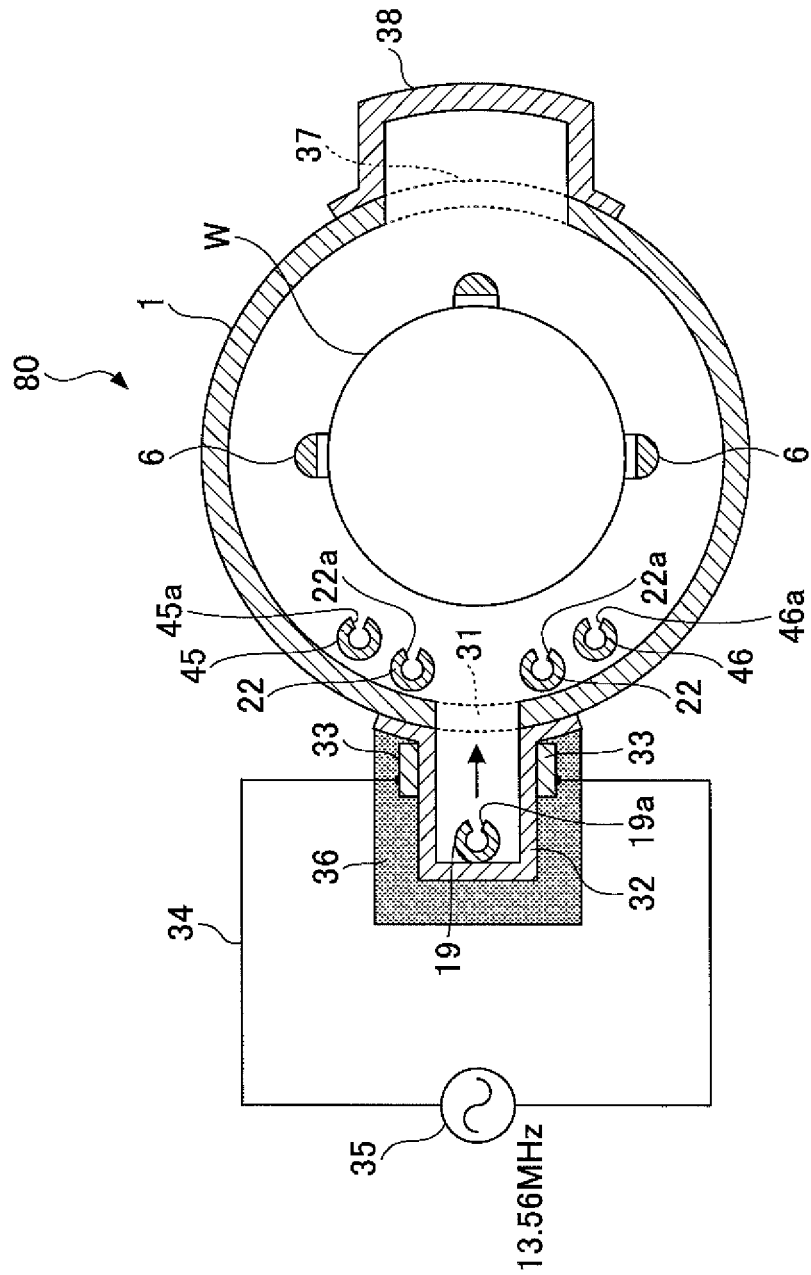
FIG. 2 is a cross-sectional view of the film deposition apparatus of FIG. 1.

FIG. 1 is a cross-sectional view illustrating a film deposition apparatus according to a first embodiment of the present invention. FIG. 2 is another cross-sectional view of the film deposition apparatus of FIG. 1.

Referring to FIG. 1, a film deposition apparatus 80 includes a process chamber 1 that has a cylindrical shape with a closed top and an opened bottom and is made of, for example, quartz glass. A ceiling plate 2 made of, for example, quartz glass is provided in an upper part of the process chamber 1. In addition, a manifold 3 that has a cylindrical shape and is made of, for example, stainless steel is coupled to the bottom opening of the process chamber 1 via a sealing member 4 such as an O-ring.

The manifold 3 includes plural through-holes that are formed on a side wall of the manifold 3, and plural pipes are connected to the corresponding through-holes, thereby supplying corresponding gases. A lid part 9 that opens or closes a bottom opening of the manifold 3 and is made of, for example, stainless steel is coupled to the bottom part of the manifold 3 via a sealing member 12 made of, for example, an O-ring. The lid part 9 has a hole in the center, and a rotational shaft 10 goes through the center opening of the lid part 9 in an air-tight manner. A table 8 is attached on a top end part of the rotational shaft 10, and a wafer boat 5 is provided on the top end part of the rotational shaft 10 via a heat retaining cylinder 7 made of, for example, quartz glass. The wafer boat 5 has three pillars 6 (see FIG. 2) that have grooves by which plural wafers W are supported. The rotational shaft 10 is rotated around a center axis of the rotational shaft 10 by a rotational mechanism (not shown), so that the wafer boat 5 is also rotated.

A bottom of the rotational shaft 5 is attached to an arm 13 that is elevatably supported by an elevation mechanism (not shown). Due to upward or downward movement of the arm 13, the wafer boat 5 is transferred into or out from the process chamber 1.

Incidentally, a magnetic fluid seal 11 is provided between the rotational shaft 10 and the opening of the lid part 9, thereby isolating the process chamber 1 from an outer environment.

In addition, the film deposition apparatus 80 is provided with an oxygen-containing gas supplying mechanism 14 that supplies an oxygen-containing gas to the process chamber 1, a silicon-containing gas supplying mechanism 15, a fluorinate acid (HF) gas supplying mechanism 210 that supplies a HF gas to the process chamber 1, and an ammonia (NH$_3$) gas supplying mechanism 240 that supplies an NH$_3$ gas to the process chamber 1. The oxygen-containing gas supplying mechanism 14 and the silicon-containing gas mechanism 15 are used to deposit a silicon oxide film on the wafers W within the process chamber 1, and the HF gas supplying mechanism 210 and the NH$_3$ gas supplying mechanism 240 are used to etch (a part of) the silicon oxide film deposited on the wafers W.

The oxygen-containing gas supplying mechanism 14 includes a oxygen-containing gas supplying source 17, a oxygen-containing gas supplying pipe 17L that guides the oxygen-containing gas from the oxygen-containing gas supplying source 17, and an oxygen-containing gas distribution nozzle 19. The oxygen-containing gas distribution nozzle 19 is connected to the oxygen-containing gas supplying pipe 17L, passes through the manifold 3, and is bent upward within the process chamber 1. The oxygen-containing gas distribution nozzle 19 is made of, for example, quartz glass. Plural gas ejection holes 19a are formed at predetermined intervals in a vertically extending part of the oxygen-containing gas distribution nozzle 19, so that the oxygen-containing gas is uniformly ejected in a horizontal direction from each of the plural gas ejection holes 19a.

In addition, the oxygen-containing gas supplying pipe 17L is provided with an open/close valve 17a and a flow rate controller 17b that controls a flow rate of the oxygen-containing gas. With these, the start/stop of supplying the oxygen-containing gas and the flow rate of the oxygen-containing gas are controlled.

The silicon-containing gas supplying mechanism 15 includes a silicon-containing gas source 20, a silicon-containing gas supplying pipe 20L that guides the silicon-containing gas from the silicon-containing gas supplying source 20, and a silicon-containing gas distribution nozzle 22. The silicon-containing gas distribution nozzle 22 is connected to the silicon-containing gas supplying pipe 20L, passes through the manifold 3, and is bent upward within the process chamber 1 to extend in a vertical direction. The silicon-containing gas distribution nozzle 22 is made of, for example, quartz glass. Referring to FIG. 2, two silicon-containing gas distribution nozzles 22 are provided in this embodiment. Plural gas ejection holes 22a are formed at predetermined intervals in a vertically extending part of each of the silicon-containing gas distribution nozzles 22, so that the silicon-containing gas is uniformly ejected in a horizontal direction from each of the plural gas ejection holes 22a. Incidentally, the number of the silicon-containing gas distribution nozzles 22 is not limited to two, but may be only one, or three or more.

In addition, the silicon-containing gas supplying pipe 20L is provided with an open/close valve 20a, a flow rate controller 20b, a buffer tank 180, and an open/close valve 20c. For example, when the open/close valve 20a is opened while the open/close valve 20c is closed and the silicon-containing gas is supplied from the silicon-containing gas supplying source 20, the silicon-containing gas is temporarily retained in the buffer tank 180. Then, when the open/close valve 20a is closed and the open/close valve 20c is opened, a predetermined amount of the silicon-containing gas retained in the buffer tank can be supplied to the process chamber 1. With the open/close valves 20b, 20c, and the flow rate controller 20b, the start/stop of supplying the oxygen-containing gas and the flow rate of the oxygen-containing gas are controlled.

The HF gas supplying mechanism 210 includes an HF gas source 21, an HF gas supplying pipe 21L that is connected to HF gas supplying source 21 and guides the HF gas from the HF gas supplying source 21, and an HF gas distribution nozzle 45. The HF gas distribution nozzle 45 is connected to the HF gas supplying pipe 21L, passes through the manifold 3, and is bent upward within the process chamber 1 to extend in a vertical direction. The HF gas distribution nozzle 45 is made of, for example, a ceramic material. Plural gas ejection holes 45a are formed at predetermined intervals in a vertically extending part of each of the HF gas distribution nozzles 45, as shown in FIG. 2, so that the HF gas is uniformly ejected in a horizontal direction from each of the plural gas ejection holes 45a.

In addition, the HF gas supplying pipe 21L is provided, with an open/close valve 21a and a flow rate controller 21b that controls a flow rate of the HF gas. With these, the start/stop of supplying the HF gas and the flow rate of the HF gas are controlled.

The NH$_3$ gas supplying mechanism 240 includes an NH$_3$ gas supplying source 24, an NH$_3$ gas supplying pipe 24L that is connected to the NH$_3$ gas supplying source 24 and guides the NH$_3$ gas from the NH$_3$ gas supplying source 24, and an NH$_3$ gas distribution nozzle 46. The NH$_3$ gas distribution nozzle 46 is connected to the NH$_3$ gas supplying pipe 24L, passes through the manifold 3, and is bent upward within the process chamber 1. The NH$_3$ gas distribution nozzle 46 is made of, for example, quartz glass. Plural gas ejection holes 46a are formed at predetermined intervals in a vertically extending part of the NH$_3$ gas distribution nozzle 46, so that the NH$_3$ gas is uniformly ejected in a horizontal direction from each of the plural gas ejection holes 46a.

In addition, the NH$_3$ gas supplying pipe 24L is provided with an open/close valve 24a and a flow rate controller 24b that controls a flow rate of the NH$_3$ gas. With these, the start/stop of supplying the NH$_3$ gas and the flow rate of the NH$_3$ gas are controlled.

A plasma generation mechanism 30 is formed in a part of the circumferential wall of the process chamber 1. The plasma generation mechanism 30 includes an opening 31 that is made in the circumferential wall of the process chamber 1 and has the shape of a vertically oblong rectangle, and a plasma partitioning wall 32 that is welded to cover the opening 31 from the outside. Specifically, the plasma partitioning wall 32 has a box shape that has a vertical length sufficient to cover the opening 31, and is made of, for example, quartz glass. Because of the plasma partitioning wall 32, it appears that a part of the circumferential wall of the process chamber 1 is indented outward. An inner space of the plasma partitioning wall 32 communicates with an inner space of the process chamber 1. In addition, the opening 31 is long enough in a vertical direction to span from the lowest wafer W to the highest wafer W loaded in the wafer boat 5.

In addition, the plasma generation mechanism 30 includes a pair of plasma electrodes 33, 33 and a high frequency power source 35 that supplies high frequency power to the plasma electrodes 33, 33 via a feed line 34. One of the plasma electrodes 33, 33 extends in a vertical direction near one of outer side surfaces of the plasma partitioning wall 32, and the other one of the plasma electrodes 33, 33 extends in a vertical direction near the other one of the outer side surfaces of the plasma partitioning wall 32, so that the plasma electrodes 33, 33 oppose each other across the plasma portioning wall 32. When electric power at a frequency of 13.56 MHz is applied from the high frequency power source 35 to the plasma electrodes 33, 33, plasma is generated within the plasma partitioning wall 32. Incidentally, the frequency of the electric power is not limited to 13.56 MHz, but may be 400 kHz, for example.

Incidentally, as shown in FIG. 1, the oxygen-containing gas distribution nozzle 19 is bent in an outward direction and then bent again upward near the inner surface of the plasma partitioning wall 32, thereby to extend upward along the inner surface of the plasma partitioning wall 32. Therefore, the oxygen-containing gas ejected from the plural gas ejection holes 19a of the oxygen-containing gas distribution nozzle 19 flows through the inner space of the plasma partitioning wall 32, and is electromagnetically excited by the electric power supplied to the plasma electrodes 33, 33, thereby generating the plasma. In other words, the oxygen-containing gas is excited sufficiently to be transformed into plasma and flows toward the center of the process chamber 1.

An insulating protection cover 36 is attached on the outer surface of the plasma partitioning wall 32, so that the plasma partitioning wall 32 and the plasma electrodes 33, 33 are covered by the insulating protection cover 36. In addition, a cooling fluid conduit (not shown) is formed in the inside of the insulating protection cover 36. When cooled nitrogen gas is supplied to the cooling fluid conduit, the plasma electrodes 33, 33 can be cooled.

The two silicon-containing gas distribution nozzles 22 vertically extend one on one side of the opening 31 and the other on the other side of the opening 31 of the process chamber 1. The two silicon-containing gas distribution nozzles 22 eject the silicon-containing gas toward a center part of the process chamber 1 from the plural ejection holes 22a of the corresponding silicon-containing gas distribution nozzles 22.

Incidentally, as the silicon-containing gas, dichlorosilane (DCS), hexachlorodisilane (HCD), monosilane (SiH$_4$), disilane (Si$_2$H$_6$), hexamethyldisilazane (HMDS), tetrachlorosilane (TCS), disilylamine (DSA), trisilylamine (TSA), bis (tertiary-butylamino) silane (BTBAS), diisopropylaminosilane (DIPAS) or the like may be used. In addition, as the oxygen-containing gas, nitrogen monoxide (N$_2$O) gas, oxygen (O$_2$) gas, ozone (O$_3$) gas or the like may be used.

An evacuation opening 37 for evacuating the process chamber 1 is provided on the other side of the opening 31 in the process chamber 1. The evacuation opening 37 has a vertically oblong rectangular shape in this embodiment, and is formed by removing a part of the circumferential wall of the process chamber 1. As shown in FIG. 2, an evacuation opening cover member 38, which has a substantially U-shaped cross-section, is welded onto the outer circumferential surface of the process chamber 1 in order to cover the evacuation opening 37. The evacuation opening cover member 38 extends upward along the outer circumferential wall of the process chamber 1, and defines a gas outlet port 39 in an upper part of the process chamber 1. The gas outlet port 39 is connected to a vacuum pump VP via a main valve MV and a pressure controller PC, so that the process chamber 1 is evacuated at a controlled pressure by the vacuum pump VP. The vacuum pump VP may include a mechanical booster pump and a turbo molecular pump.

In addition, a heating unit 40 having a cylindrical shape is provided in order to surround the process chamber 1, as shown in FIG. 1, so that the wafers W in the process chamber 1 are heated. Incidentally, the heating unit 40 is omitted in FIG. 2.

The film deposition apparatus 80 is provided with a controller 50 including a microprocessor (or computer) that controls operations of the film deposition apparatus 80. For example, the controller 50 controls on/off operations of the open/close valves 17a, 20a, 20c, 21a and 24a, thereby controlling starting/stopping the gases; controls the flow rate controllers 17b, 20b, 21b, and 24b, thereby adjusting flow rates of the gases; and controls the high frequency power supply 35. In addition, the controller 50 controls the heating unit 40, thereby heating the wafers W at a predetermined temperature. The controller 50 is connected to a user interface 51 composed of a keyboard (not shown) through which an operator can input process parameters or commands and a display (not shown) that may illustrate process situations.

In addition, the controller 50 is connected to a memory part 52 that stores programs or recipes for the controller 50 to cause the film deposition apparatus 80 to carry out various treatments with respect to the wafers W. The programs include a film deposition program by which a film deposition method (described later) is carried out by the film deposition apparatus 80 under control of the controller 50. In addition, the programs are stored in a computer readable storage medium 52a and downloaded to the memory part 52. The computer readable storage medium 52a may be a hard disk, a semiconductor memory, a compact disk—read only memory (CD-ROM), a digital versatile disk (DVD), a flash memory or the like. In addition, the programs may be downloaded to the memory part 52 from another apparatus through, for example, a dedicated network.

When necessary, an arbitrary program is read out from the memory part 52 in response to instructions from the user interface 51, and is executed by the controller 50, so that a corresponding treatment is carried out under control of the controller 50. When the film deposition program is carried out, the controller 50 serves as a controlling unit that controls the components and parts of the film deposition apparatus 80, thereby carrying out the film deposition method.

(Second Embodiment)

Figure 4B:
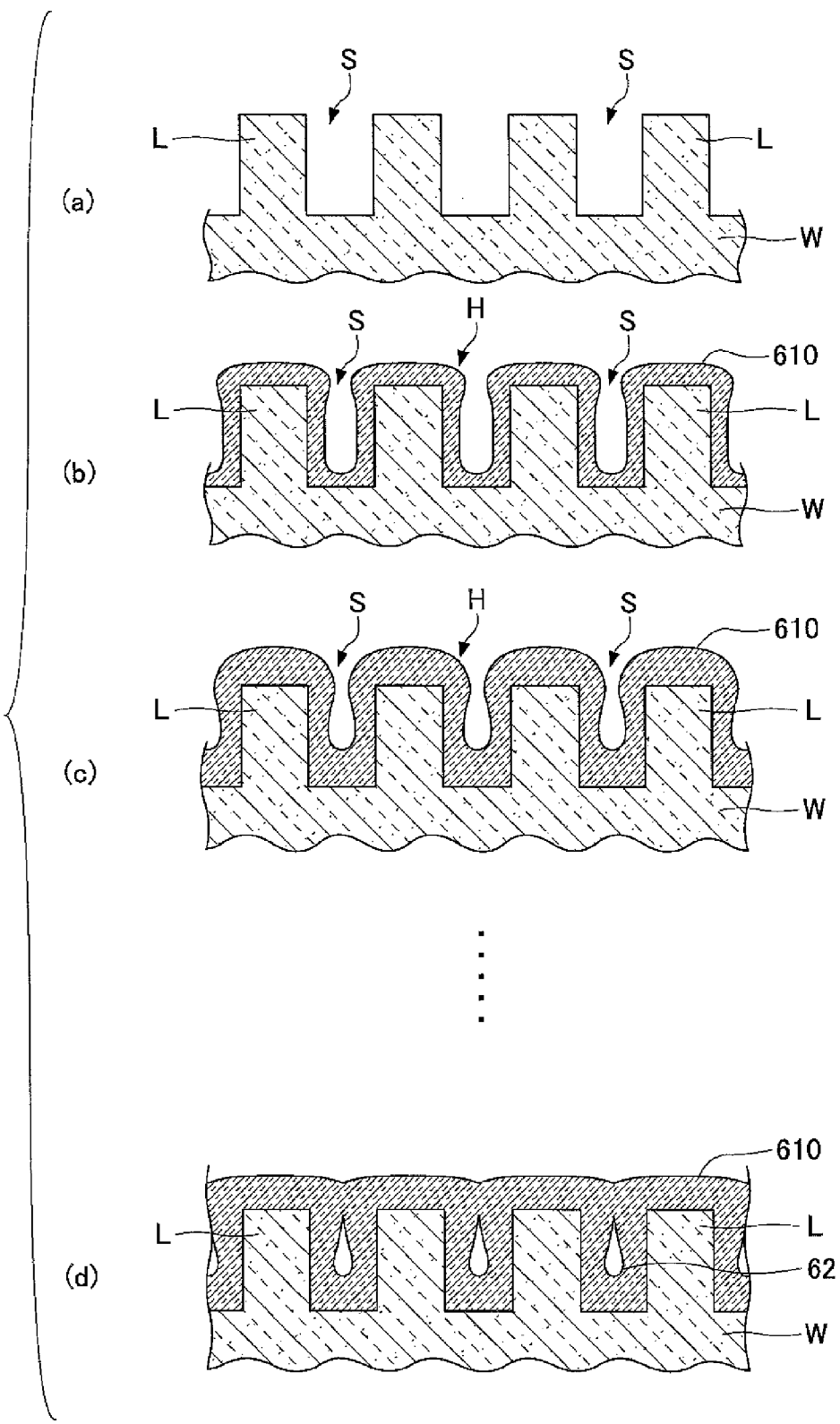
FIG. 4B is a schematic cross-sectional view of a substrate and a silicon oxide film after corresponding primary steps of a film deposition method according to a comparison example.

Next, a film deposition method according to a second embodiment of the present invention is explained with reference to FIGS. 3 and 4A. The film deposition method is carried out in the film deposition apparatus 80 in this embodiment, but may be carried out in any other film deposition method in the various other embodiments discussed herein. FIG. 3 is a time chart illustrating the film deposition method of this embodiment, and FIG. 4A illustrates cross-sectional views of a wafer W on which a silicon oxide film is deposited by the film deposition method, after corresponding primary steps are completed.

Referring to Section (a) of FIG. 4A, on a wafer W, there are formed plural lines L, each of which has a width of, for example, about 30 nm, and thus there are formed plural spaces, each of which has a width of, for example, about 30 nm, between the corresponding adjacent lines L. Such a line-and-space pattern may be formed by, for example, a double patterning method. Incidentally, the lines L are made of silicon in the illustrated example, but may be made of metal in other embodiments.

First, the wafers W, each of which has the pattern shown in Section (a) of FIG. 4A, are loaded in the wafer boat 5, and the wafer boat 5 is in turn transferred into the process chamber 1 by the arm 13. Then, the main valve MV is opened without supplying any gases into the process chamber 1, and the pressure controlling valve of the pressure controlling part PC is fully opened, thereby evacuating the process chamber 1 to a reachable lowest pressure by the vacuum pump VP. In addition, the wafers W are heated to a temperature of about 10° C. through 700° C. by the heating unit 40.

Next, a silicon oxide film is deposited on the wafer W at Step S1 (FIG. 3). Specifically, the open/close valve 17a of the oxygen-containing gas supplying pipe 17L is opened, and thus the $N_2O$ gas filling the oxygen-containing gas source 17 is supplied at a flow rate controlled by the flow rate controller 17b to the oxygen-containing gas dispersion nozzle 19. The $N_2O$ supplied to the oxygen-containing gas dispersion nozzle 19 flows toward the wafers W from the plural gas ejection holes 19a.

On the other hand, the open/close valves 20a, 20c of the silicon-containing gas supplying pipe 20L are opened, and thus the DCS gas filling the silicon-containing gas source 20 is supplied at a flow rate controlled by the flow rate controller 20b to the silicon-containing gas dispersion nozzle 22 and then ejected from the plural gas ejection holes 22a toward the wafers W. The DCS gas and the $N_2O$ gas react with each other near the upper surfaces of the wafers W, and thus a silicon oxide film 61 is deposited on the wafer W in order to cover the line-and-space pattern as shown in Section (b) of FIG. 4A. When a film thickness of the silicon oxide film 61 becomes, for example, about 15 nm, supplying the DCS gas and the $N_2O$ gas is terminated, thereby completing a film deposition step (S1). Incidentally, a time that it takes until the film thickness becomes about 15 nm may be determined based on a flow rate obtained by carrying out a preliminary experiment. In addition, the silicon oxide film 61, which may be referred to as a high temperature oxide (HTO), becomes thicker in and around an upper end of a side wall of the line L, and thus has a so-called "over hang shape" (or "bread loaf profile") in cross section, as shown in Section (b) of FIG. 4A in an exaggerating manner.

Next, a temperature of the wafers W is changed to, for example, 25° C. through 300° C. by controlling the heating unit 40 at a condition changing step S2 (FIG. 3). After the temperature has been stabilized, a chemical oxide removal (COR) step S3 is carried out. Specifically, the open/close valve 21a of the HF gas supplying pipe 21L (FIG. 1) is opened, and thus the HF gas is supplied at a flow rate controlled by the flow rate controller 21b (for example, 10 standard cubic centimeters per minute (sccm) to 5000 sccm, preferably 200 sccm to 1000 sccm) from the HF gas source 21 to the HF gas dispersion nozzle 45. Then, the HF gas is ejected from the plural gas ejection holes 45a of the HF gas dispersion nozzle 45 toward the wafers W. Along with this, the open/close valve 24a of the $NH_3$ gas pipe 24L is opened, and thus the $NH_3$ gas is supplied at a flow rate controlled by the flow rate controller 24b (for example, 10 sccm to 5000 sccm, preferably 200 sccm to 1000 sccm) to the $NH_3$ gas dispersion nozzle 46 from the $NH_3$ gas source 24. Then, the $NH_3$ gas is ejected from the plural gas ejection holes 46a of the $NH_3$ gas dispersion nozzle 46 toward the wafers W. At this time, a pressure within the process chamber 1 is controlled to, for example, 10 Pa to 13.3 kPa by the pressure controller PC.

An upper surface layer of the oxide film 61 deposited on the wafer W react with the HF gas and the $NH_3$ gas and altered into an ammonium fluorosilicate (($NH_4$)$_2SiF_6$). Ammonium can be sublimated at a temperature of about 130° C. or more, and thus the silicon oxide film 61 is etched to became thinner, as shown in Section (c) of FIG. 4A. In addition, the above conditions (flow rates of the HF gas and the $NH_3$ gas, a pressure within the process chamber 1, a temperature of the wafers W, and the like) are determined so that an etching rate of the silicon oxide film 61 is greater in the upper surfaces of the lines L and in and around the upper end of the side walls of the lines L and less in a bottom part of the spaces S. It is preferable that such conditions may be determined from results of preliminary experiment or computer simulations. With such an etching rate difference, the over hang parts H in the upper end portion of the lines L substantially disappear, and an opening of the line L defined by the silicon oxide film 61 is narrow at the bottom and becomes wider toward the top end.

Next, the open/close valves 21a, 24a are closed thereby terminating supplying the HF gas and the $NH_3$ gas; the process chamber 1 is evacuated to a lowest reachable pressure; and the heating unit 40 is adjusted, in order to change the temperature of the wafers W to the film deposition temperature (a condition changing step S4). After the temperature has been stabilized at the film deposition temperature, the film deposition step S1 is carried out again. At this time, the over hang shape is not likely to be formed, as shown in Section (d) of FIG. 4A, because the silicon oxide is further deposited on the silicon oxide film 61 that has an opening that becomes wider from the bottom to the upper end thereof, which is realized in the COR step S3.

Then, the condition changing step S2, the COR step S3, the condition changing step S4, and the film deposition step S1 are repeated in this order. Namely, the upper end part of the silicon oxide film 61 deposited on the side walls of the line L is etched at a higher etching rate, thereby making a cross-sectional shape of the silicon oxide film in the space S be substantially a V-shape, as shown in Section (e) of FIG. 4A, and then the silicon oxide is deposited on the silicon oxide film 61. Therefore, the V-shape becomes shallow as the silicon oxide film 61 becomes thicker.

In such a manner, the film deposition step S1, the condition changing step S2, the COR step S3, and the condition changing step S4 are repeated until a thickness of the silicon oxide film 61 on the wafer W (or a thickness of the silicon oxide film 61 on the line L) becomes a predetermined thickness. As a result, the space S is filled with the silicon oxide film 61, as shown in Section (f) of FIG. 4A.

As described above, according to the film deposition method of this embodiment, a film deposition of the silicon oxide film 61 using the DCS gas serving as the silicon-containing gas and the $N_2O$ gas serving as the oxygen-containing gas (film deposition step S1), and the etching of the silicon oxide film 61 using the HF gas and the $NH_3$ gas (COR step S3) are alternately repeated in the same process chamber 1. In the COR step S3, the etching rate is higher in the upper end part of the side walls of the line L than the bottom of the space S, so that the opening defined by the silicon oxide film 61 in the space S becomes wider toward the top of the space S. Therefore, the space S is filled with the silicon oxide from the bottom (or in a bottom-up manner), without leaving voids in the filled space S. If the COR step S3 is not carried out and the film deposition step S1 continues to be carried out using the DCS gas and the $N_2O$ gas, the over hang part H grows as shown in Sections (a) through (c) of FIG. 4B, so that the two adjacent over hang parts H come in contact with each other, forming a void 62 in a silicon oxide film 610 that fills the space S, as shown in Section (d) of FIG. 4B. Comparing this, the effects or advantages of the film deposition method according to this embodiment can be understood.

(Third Embodiment)

Next, a film deposition method according to a third embodiment of the present invention is explained with reference to FIG. 5A. Even in this embodiment, the film deposition apparatus 80 is used. In addition, the film deposition method of this embodiment includes the film deposition step S1, the condition changing step S2, the COR step S3, and the condition changing step S4 that are shown in FIG. 3. Moreover, in this embodiment, the BTBAS gas serving as the silicon-containing gas and the oxygen gas ($O_2$) serving as the oxygen-containing are used in the film deposition step S1, so that silicon oxide is deposited based on an atomic layer deposition method. In the following explanation, the differences relative to the second embodiment are focused.

Figure 5A:
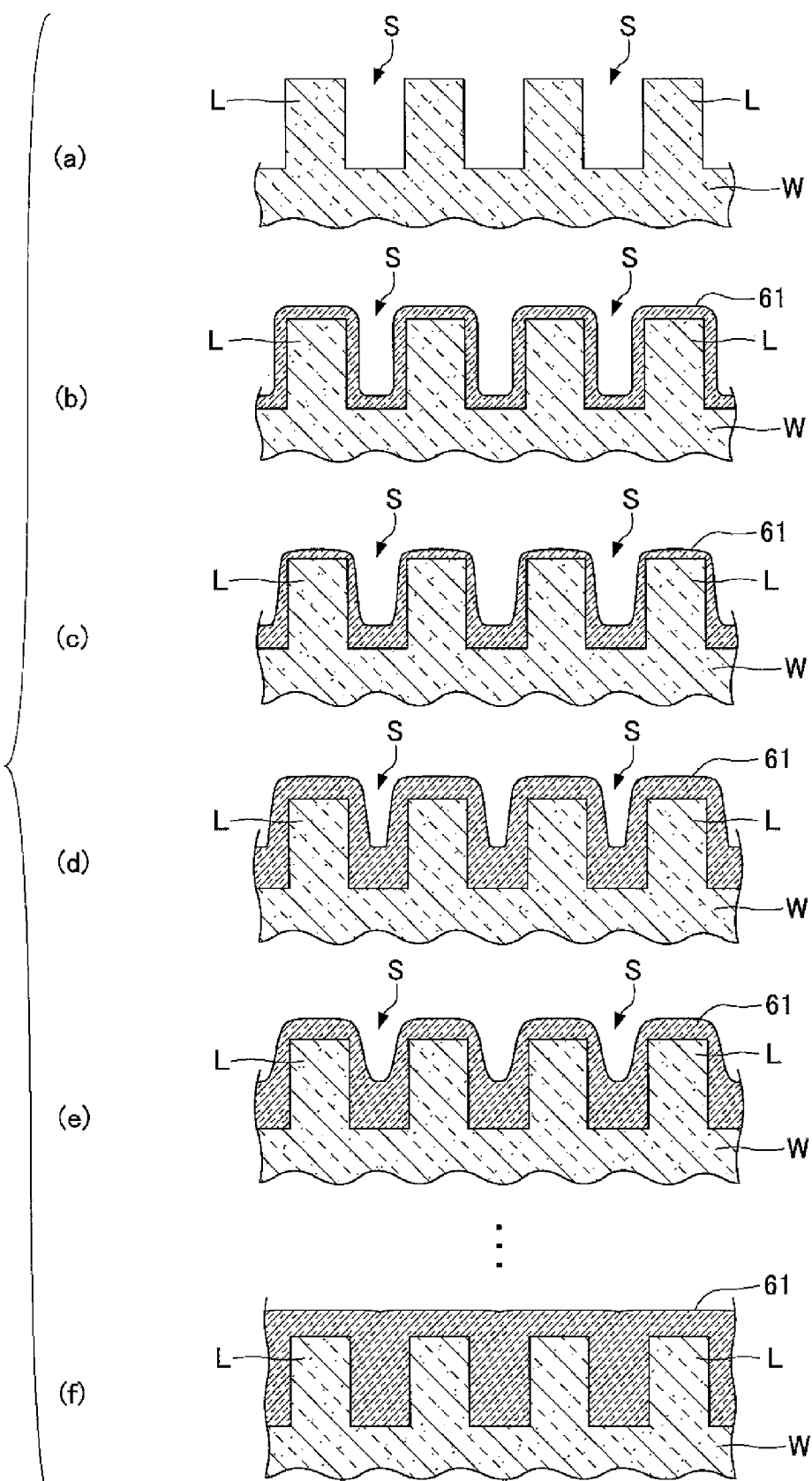
FIG. 5A is a schematic cross-sectional view of a substrate and a silicon oxide film after corresponding primary steps of the film deposition method according to a third embodiment.

First, the wafers W having the line-and-space pattern shown in Section (a) of FIG. 5A are housed in the process chamber 1, and the process chamber 1 is evacuated to a lowest reachable pressure. The wafers W are heated to, for example, 10° C. to 500° C. by the heating unit 40. In the meantime, the open/close valve 20*a* in the silicon-containing gas pipe 20L that connects the silicon-containing gas source 20 and the process chamber 1 while the open/close valve 20*c* is kept closed, so that the BTBAS gas is supplied at a flow rate controlled by the flow rate controller 20*b* to the buffer tank 180 and is retained in the buffer tank 180. In this case, an amount of the BTBAS gas retained in the buffer tank 180 may be determined so that the upper surfaces of the wafers W supported by the wafer boat 5 can be covered with BTBAS gas molecules. Such an amount is preferably determined by carrying out a preliminary experiment.

Next, when the open/close valve 20*c* is opened while the open/close valve 20*a* is kept closed, the BTBAS gas retained in the buffer tank 180 is supplied to the process chamber 1 through the silicon-containing gas supplying pipe 20L and the silicon-containing gas dispersion nozzle 22. With this, the BTBAS gas is adsorbed on the upper surfaces of the wafers W. Subsequently, when the open/close valve 20*c* is closed and then the open/close valve 17*a* of the oxygen-containing gas pipe 17L is opened, the $O_2$ gas is supplied at a flow rate controlled by the flow rate controller 17*b* to the process chamber 1 through the oxygen-containing gas pipe 17L and the oxygen-containing gas dispersion nozzle 19. Here, high frequency power is applied to the electrodes 33, 33 from the high frequency power source 35 of the plasma generation mechanism 30, thereby generating plasma from the $O_2$ gas. Thus, the $O_2$ plasma, which includes oxygen radicals, oxygen ions, or the like, is supplied to the wafers W. With this, the BTBAS gas adsorbed on the wafers W is oxidized, so that one or more layers of molecules of silicon oxide (the silicon oxide film 61) are deposited. Next, adsorption of the BTBAS gas onto the upper surfaces of the wafers W and oxidation of the BTBAS gas with the $O_2$ plasma are repeated a predetermined number of times, thereby depositing the silicon oxide film 61 having a predetermined thickness, as shown in Section (b) of FIG. 5A. According to such an ALD method, the silicon oxide film 61 can have substantially the same thickness on the side walls and the upper surfaces of the lines L of the line-and-space pattern and on the bottom parts of the space S of the line-and-space pattern. In other words, the silicon oxide film 61 has a cross-sectional shape that reflects the underlying pattern (or geography), or a conformal cross-sectional shape.

Next, the condition changing step S2 and then the COR step S3 are carried out in the same manner as in the second embodiment. With these steps, the silicon oxide film 61 is etched at a higher etching rate in the upper end parts of the side walls and the upper surfaces of the lines L than in the bottom parts of the spaces S. Therefore, the cross-sectional shape of the spaces S defined by the silicon oxide film 61 is opened wider toward the top. Incidentally, conditions in the COR step S3 may be determined in the same manner as described in the second embodiment.

Next, the condition changing step S4, the film deposition step S1, the condition changing step S2, and the COR step S3 are repeated, so that the silicon oxide film 61 becomes thicker, as shown in Sections (d) and (e) of FIG. 5A, and finally, the spaces S are filled with the silicon oxide film 61 without voids.

Figure 5B:
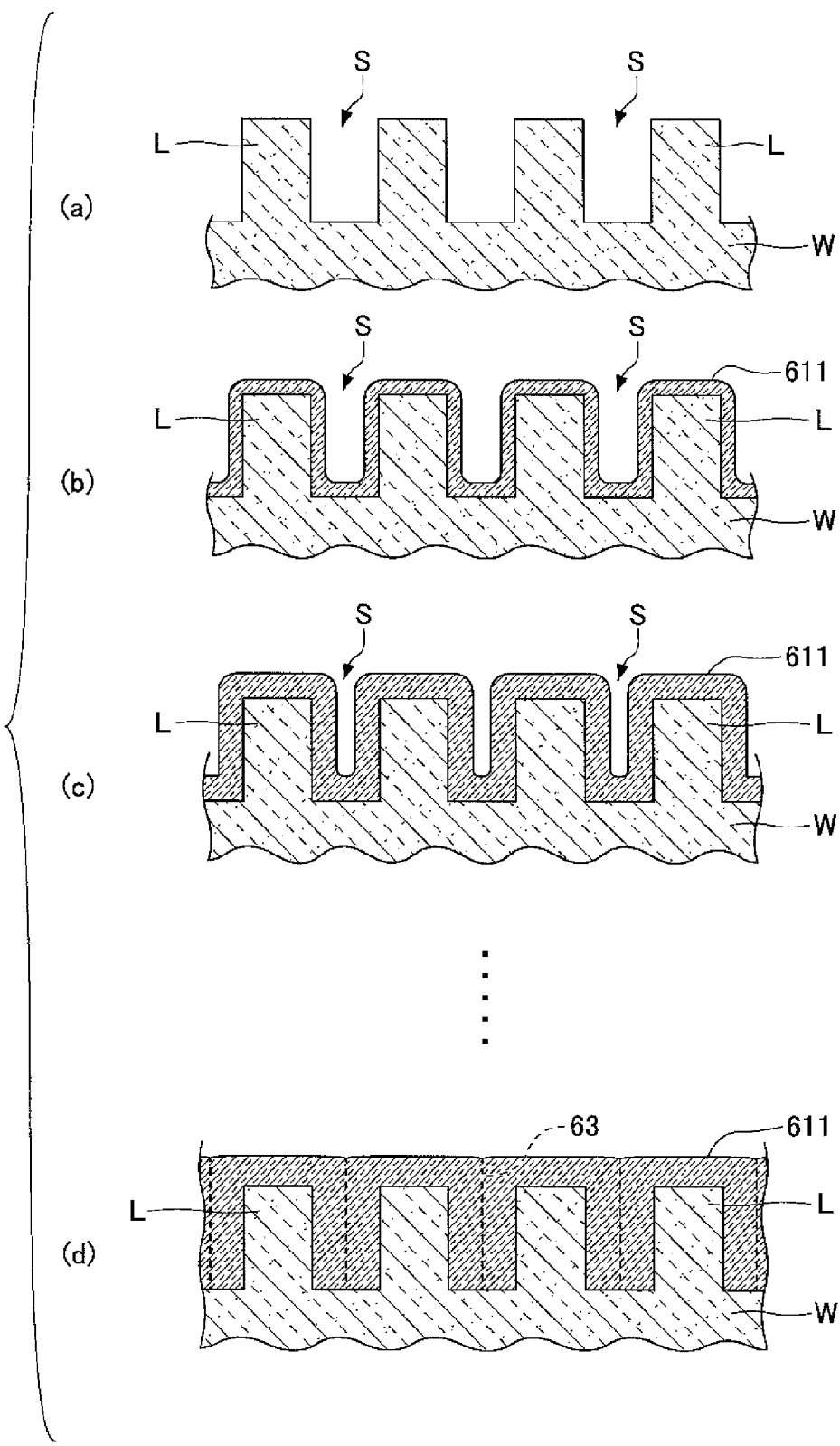
FIG. 5B is a schematic cross-sectional view of a substrate and a silicon oxide film after corresponding primary steps of a film deposition method according to another comparison example.

If the ALD of the silicon oxide film is carried out using the BTBAS gas and the $O_2$ plasma without carrying out the COR step S3, a silicon oxide film 611 becomes thicker keeping the conformal cross-sectional shape, as shown in Sections (b) and (c) of FIG. 5B. In this case, a surface of the silicon oxide film 611 deposited on one side wall of the line L and a surface of the silicon oxide film 611 deposited on the opposite side wall of the same line L come closer to each other as the silicon oxide film 611 becomes thicker. At a time right before the two surfaces come in contact with each other, there is only a slight gap therebetween, which impedes by-products of the BTBAS gas and the $O_2$ plasma (for example, organic materials caused from the BTBAS gas) from being evacuated out through the gap to the inner space of the process chamber 1. Therefore, the by-products may be incorporated in the silicon oxide film 611, and specifically, concentrated at a boundary (seam) 63 between the two surfaces. In addition, there may be high concentrated crystalline defects at the seam 63 because chemical bonds may not be formed between silicon atoms and oxygen atoms when the two surfaces come in contact with each other. Namely, the film properties may be degraded at the seam 63 of the silicon oxide film 611. In this case, a problem may be caused that the seam 63 may be excessively etched in a subsequent etching process for the silicon oxide film 611.

However, according to the film deposition apparatus of this embodiment, the spaces S defined by the silicon oxide film 61 become wider toward the tops of the spaces S to be substantially a V-shape in cross section by etching the silicon oxide film 61 using the HF gas and the $NH_3$ gas in the COR step S3, as shown in Sections (c) and (e) of FIG. 5A. When the film deposition step S1 and the COR step S3 are alternately carried out with respect to the spaces S having such a V-shape, the V-shape becomes shallow. Therefore, the seam is not likely to be formed, which is different from a case where the silicon oxide films 61 deposited on the side walls of the space S come in contact with each other. Namely, according to this embodiment, the spaces S can be filled with the silicon oxide film 61 while impurities are not locally accumulated and a defect density is not locally increased.

While the present invention has been described in reference to the foregoing embodiments, the present invention is not limited to the disclosed embodiments, but may be modified or altered within the scope of the accompanying claims.

While the HTO method using the DCS gas and the $N_2O$ gas and the ALD method using the BTBAS gas and the $O_2$ plasma are exemplified in the above embodiments, a film deposition method employed in the film deposition step S1 is not limited to these methods. For example, a film deposition method using monosilane gas and the $N_2O$ gas may be employed. Alternatively, a film deposition method using tetra-ethyl-ortho-silicate (TEOS) and ozone ($O_3$) gas may be employed. In this case, an ozonizer may be provided in, for example, the silicon-containing gas supplying pipe 17L of the film deposition apparatus 80 in order to generate the $O_3$ gas.

In addition, the silicon-containing gas and/or the oxygen-containing gas may be arbitrarily selected depending on the film deposition method employed. For example, as the oxygen-containing gas to be used in the ALD method, NO gas, $N_2O$ gas, $H_2O$ gas, or $O_3$ gas may be used rather than the $O_2$ gas. In addition, when the DIPAS gas serving as the silicon-containing gas and the $O_2$ plasma serving as the oxygen-containing gas are used, the silicon oxide film can be deposited at a temperature from room temperature (for example, about 25° C.) to about 100° C. Moreover, when the DIPAS gas and the $O_3$ gas are used, a film deposition temperature of the silicon oxide film is from about 20° C. to about 500° C.

In addition, while the HF gas and the $NH_3$ gas are used in the COR step S3 in the above embodiments, $NF_3$ gas may be used instead of the HF gas in other embodiments. When the $NF_3$ gas is used, a temperature of the wafer W needs to be about 600° C. in the COR step S3. On the other hand, a temperature of the wafer W may be about 700° C. to about 850° C. in the film deposition step S1 in the case of the HTO using the DCS gas and the $N_2O$ gas in the film deposition method S1. Therefore, a temperature difference adjusted in the condition changing steps S2, S4 can be reduced in the case of the HTO using the DCS gas and the $N_2O$ gas, which can reduce a time period required for the condition changing steps S2, S4, thereby improving a production throughput.

On the contrary, a temperature of the wafer W is about 25° C. to about 300° C. when the HF gas and the $NH_3$ gas are used in the COR step S3. Therefore, the BTBAS gas and the $O_2$ plasma (or the DIPAS gas and the $O_2$ plasma) are preferably used in the case of using the HF gas and the $NH_3$ gas in the COR step S3, because use of such gases enables the silicon oxide film to be at a temperature close to the COR temperature. Incidentally, when the HF gas and the $NH_3$ gas are used in the COR step S3, temperatures of the wafer W in the COR step S3 and the film deposition step S1 are preferably set so that the ammonium fluorosilicate is sublimated where a temperature of the wafer W is increased in the condition changing step S4 after the COR step S3. Namely, a temperature of the wafer W is preferably set to be lower than a sublimation temperature of the ammonium fluorosilicate (130° C.) in the COR step S3 and higher than the sublimation temperature in the film deposition step S1.

In addition, while the above embodiments describe a case where the spaces of the line-and-space pattern are filled with silicon oxide without forming voids, holes formed in the wafer W may be filled with silicon oxide according to the present invention.

What is claimed is:

1. A film deposition method comprising steps of:
   loading plural substrates each of which includes a pattern including a concave part in a reaction chamber, said plural substrates adjacent with each other in the form of shelves;
   depositing a silicon oxide film on the plural substrates by supplying a silicon-containing gas and an oxygen-containing gas to the reaction chamber;
   etching the silicon oxide film deposited on the plural substrates in the step of depositing by supplying an etching gas to the reaction chamber; and
   alternately repeating the step of depositing and the step of etching until said concave part is filled entirely with said silicon oxide film from a bottom of said concave part to a level above a top edge of said concave part,
   wherein said etching gas is a mixed gas including HF and $NH_3$,
   wherein said HF and $NH_3$ are supplied, in said step of etching, with respective flow rates determined such that an etching rate of said silicon oxide film is greater at said top edge of said concave part than at a bottom of said concave part,
   the film deposition method further comprising a step of lowering a substrate temperature to a first temperature lower than 130° C., the step being carried out after the step of depositing,
   the film deposition method further comprising a step of gradually raising the substrate temperature to a second temperature higher than 130° C., the step of depositing being carried out after the step of etching,
   wherein byproduct of the etching is removed during the step of gradually raising the substrate temperature by way of sublimation.

2. The film deposition method of claim 1, further comprising a step of setting an etching condition suitable to be used in the step of etching, the step being carried out after the step of depositing.

3. The film deposition method of claim 1, further comprising a step of setting a deposition condition suitable to be used in the step of depositing, the step of depositing being carried out after the step of etching.

4. The film deposition method of claim 1, wherein said flow rate of HF is set to 200 sccm-1000 sccm, and said flow rate of $NH_3$ is set to 200 sccm -1000 sccm.

* * * * *